United States Patent
Kitagawa et al.

(10) Patent No.: US 12,073,864 B2
(45) Date of Patent: Aug. 27, 2024

(54) MEMORY CELL SENSING USING TWO STEP WORD LINE ENABLING

(71) Applicant: Micron Technology, Inc., Boise, ID (US)

(72) Inventors: Makoto Kitagawa, Folsom, CA (US); Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 105 days.

(21) Appl. No.: 17/740,528

(22) Filed: May 10, 2022

(65) Prior Publication Data

US 2023/0368831 A1    Nov. 16, 2023

(51) Int. Cl.
    *G11C 13/00* (2006.01)
    *G11C 11/22* (2006.01)

(52) U.S. Cl.
    CPC ........ *G11C 11/2259* (2013.01); *G11C 11/221* (2013.01); *G11C 11/2273* (2013.01); *G11C 11/2275* (2013.01)

(58) Field of Classification Search
    CPC .................................................. G11C 13/0002
    See application file for complete search history.

(56) References Cited

U.S. PATENT DOCUMENTS

| | | |
|---|---|---|
| 10,930,324 B2 | 2/2021 | Jamali et al. |
| 10,957,383 B2 | 3/2021 | Vimercati |
| 2014/0268989 A1* | 9/2014 | Hong ............... G11C 13/0002 365/148 |
| 2014/0312296 A1* | 10/2014 | Jo ....................... H10N 70/821 257/4 |
| 2020/0372944 A1 | 11/2020 | Fackenthal |

* cited by examiner

*Primary Examiner* — Jason Lappas
(74) *Attorney, Agent, or Firm* — Schwegman Lundberg & Woessner, P.A.

(57) ABSTRACT

A method of performing a memory cell operation can include maintaining a plate voltage at a first access line of a memory cell during at least a first operation and a second operation of the memory cell. The method can further include charging a second access line to a first voltage greater than zero and greater than a threshold voltage of a selector device of the memory cell during the first operation on the memory cell. The method can further include, subsequent to the first operation, charging the second access line to a second voltage greater than the plate voltage plus the threshold voltage of the selector device to perform the second operation of the memory cell.

23 Claims, 10 Drawing Sheets

MEMORY CELL SENSING USING TWO STEP WORD LINE ENABLING

FIELD OF THE DISCLOSURE

Embodiments of the disclosure relate generally to memory device. More specifically, embodiments relate to sensing and programming of memory cells of a memory device.

BACKGROUND

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. To access the stored information, a component of the device may read, or sense, at least one stored state in the memory device. To store information, a component of the device may write, or program, the state in the memory device.

Various types of memory devices exist, including those that employ magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, such as PCM and FeRAM, may maintain stored logic states for extended periods of time even in the absence of an external power source. Volatile memory devices, such as DRAM, may lose stored logic states over time unless they are periodically refreshed by a power source. In some cases, non-volatile memory may use similar device architectures as volatile memory but may have non-volatile properties by employing such physical phenomena as ferroelectric capacitance or different material phases.

Improving memory devices, generally, may include increasing memory cell density, increasing read/write speeds, increasing reliability, increasing data retention, reducing power consumption, or reducing manufacturing costs, among other metrics. Sensing the stored state of a memory cell with increased accuracy may be desirable. For example, increased sensing accuracy may provide increased reliability during a read operation.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Some types of memory, for example ferroelectric RAM (FeRAM), utilize two separate operations in the performance of reading or writing functions. These two separate operations can include sensing and programming operations that comprise setting different access lines (e.g., digit lines, plate lines, word lines) to relatively high or low levels, as described with reference to FIG. 1.

Figure 1:
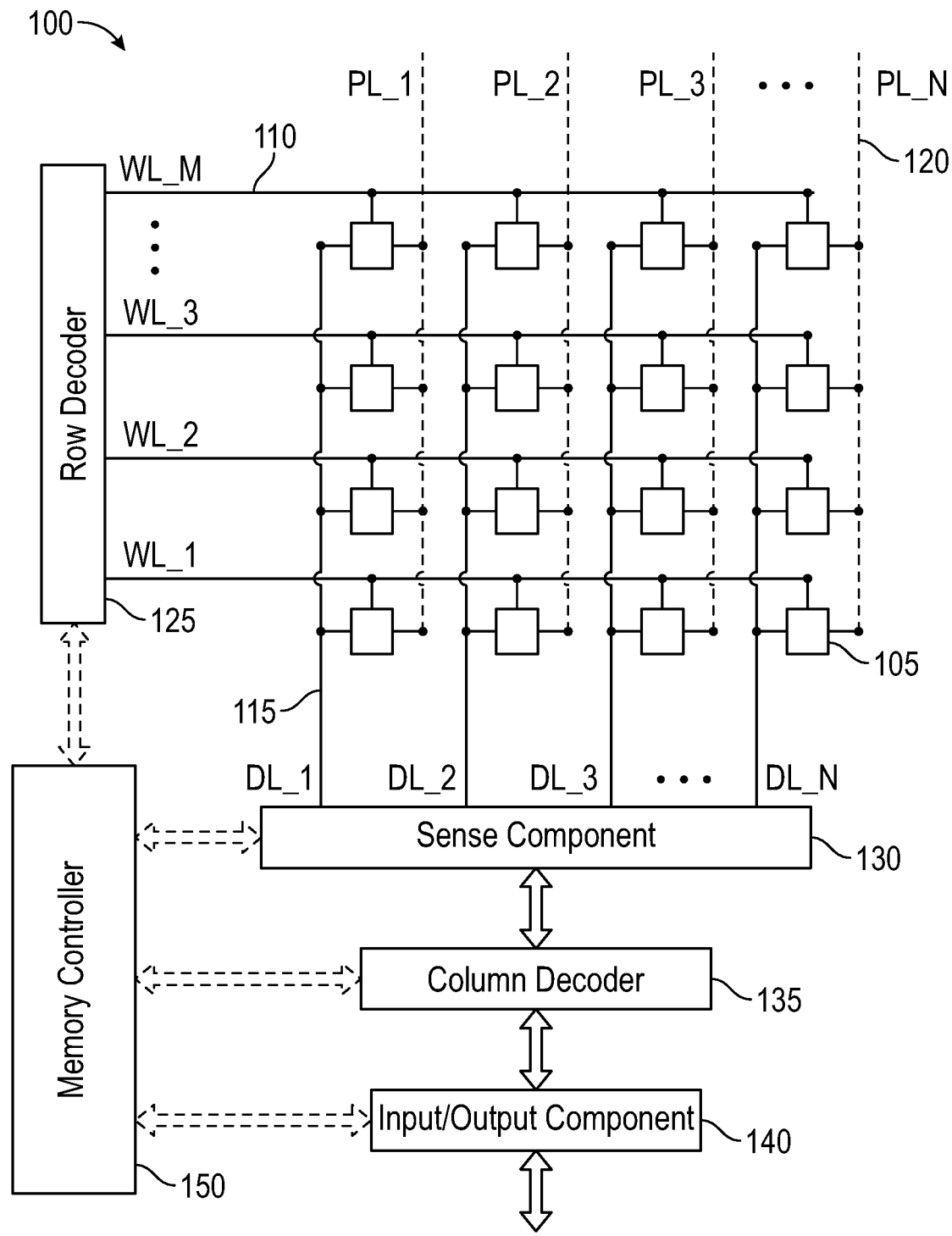
FIG. 1 illustrates an example of a system for operating a memory device in accordance with some examples of the present disclosure.

FIG. 1 illustrates an example memory device 100 in accordance with some examples of the present disclosure. Memory device 100 may also be referred to as an electronic memory apparatus. Memory device 100 includes memory cells 105 that are programmable to store different logic states. In some cases, a memory cell 105 may be programmable to store two logic states, denoted a logic 0 and a logic 1. In some cases, a memory cell 105 may be programmable to store more than two logic states.

In some examples, a memory cell 105 may store an electrical charge representative of the programmable logic states in a capacitive memory element. For example, a charged and uncharged capacitor of a memory cell 105 may represent two logic states, respectively, or a positively charged and a negatively charged capacitor of a memory cell 105 may represent two logic states, respectively. DRAM architectures may commonly use such a design, and the capacitor employed may include a dielectric material with linear or para-electric electric polarization properties as the insulator. In some examples, such as FeRAM architectures, a memory cell 105 may include a ferroelectric capacitor having a ferroelectric material as an insulating layer between terminals of the capacitor. Different levels of polarization of a ferroelectric capacitor may represent different logic states (e.g., supporting two or more logic states in a respective memory cell 105). Ferroelectric materials have non-linear polarization properties including those discussed in further detail below with reference to FIG. 3.

According to the example of FIG. 1, each row of memory cells 105 is coupled with one of a plurality of first access lines 110 (e.g., a word line (WL)), and each column of memory cells 105 is coupled with one of a plurality of second access lines 115 (e.g., a digit line (DL)). Thus, one memory cell 105 may be located at the intersection of one of the first access lines 110 and one of the second access lines 115. This intersection may be referred to as an address of the memory cell 105. In some cases, first access lines 110 and second access lines 115 may be substantially perpendicular to one another in the memory device 100. References to word lines and bit lines, or their analogues, are interchangeable without loss of understanding or operation.

In general, one memory cell 105 may be located at the intersection of (e.g., coupled with, coupled between) an access line 110 and an access line 115. This intersection may be referred to as an address of a memory cell 105. A target memory cell 105 may be a memory cell 105 located at the intersection of an energized or otherwise selected access line 110 and an energized or otherwise selected access line 115. In other words, an access line 110 and an access line 115 may be energized or otherwise selected to access (e.g., read, write) a memory cell 105 at their intersection. Other memory cells 105 that are in electronic communication with (e.g., connected to) the same access line 110 or 115 may be referred to as untargeted memory cells 105.

Although the access lines described with reference to FIG. 1 are shown as direct lines between memory cells 105 and coupled components, access lines may include other circuit elements, such as capacitors, resistors, transistors, amplifiers, voltage sources, switching components, selection components, and others, which may be used to support access operations including those described herein. In some examples, an electrode may be coupled with (e.g., between) a memory cell 105 and an access line 110, or with (e.g., between) a memory cell 105 and an access line 115. The term electrode may refer to an electrical conductor, or other electrical interface between components, and in some cases, may be employed as an electrical contact to a memory cell 105. An electrode may include a trace, wire, conductive line, conductive layer, conductive pad, or the like, that provides a conductive path between elements or components of memory device 100.

In some architectures, the logic storing component (e.g., a capacitive memory element) of a memory cell 105 may be electrically isolated from a second access line 115 by a selection component. A first access line 110 may be coupled with and may control the selection component. For example, the selection component may be a transistor and the first access line 110 may be coupled with a gate of the transistor. Activating the first access line 110 may result in an electrical connection or closed circuit between the logic storing component of the memory cell 105 and its corresponding second access line 115. The second access line 115 may then be accessed to read and/or write the memory cell 105.

In some examples, memory cells 105 may also be coupled with one of a plurality of third access lines 120 (e.g., a plate line (PL)). In some examples, the plurality of third access lines may couple memory cells 105 with a voltage source for various sensing and/or writing operations including those described herein. For example, when memory cells 105 employ a capacitor for storing a logic state, a second access line 115 may provide access to a first terminal of the capacitor, and a third access line 120 may provide access to a second terminal of the capacitor. As used herein, the term "terminal" need not suggest a physical boundary or connection point of a capacitor of a memory cell 105. Rather, "terminal" may refer to a reference point of a circuit relevant to the capacitor of the memory cell, which may also be referred to as a "node" or "reference point." Although the plurality of third access lines 120 of the memory device 100 are shown as substantially parallel with the plurality of second access lines 115, in other examples a plurality of third access lines 120 may be substantially parallel with the plurality of first access lines 110, or in any other configuration.

Access operations such as reading, writing, and rewriting may be performed on a memory cell 105 by activating or selecting a first access line 110, a second access line 115, and/or a third access line 120 coupled with the memory cell 105, which may include applying a voltage, a charge, and/or a current to the respective access line. Access lines 110, 115, and 120 may be made of conductive materials, such as metals (e.g., copper (Cu), silver (Ag), aluminum (Al), gold (Au), tungsten (W), titanium (Ti), etc.), metal alloys, carbon, or other conductive materials, alloys, or compounds. Upon selecting a memory cell 105, a resulting signal may be used to determine the stored logic state. For example, a memory cell 105 with a capacitive memory element storing a logic state may be selected, and the resulting flow of charge via an access line and/or resulting voltage of an access line may be detected to determine the programmed logic state of the memory cell 105.

Accessing memory cells 105 may be controlled through a row decoder 125 and a column decoder 135. For example, a row decoder 125 may receive a row address from the memory controller 150 and activate the appropriate first access line 110 based on the received row address. Similarly, a column decoder 135 may receive a column address from the memory controller 150 and activate the appropriate second access line 115. Thus, in some examples a memory cell 105 may be accessed by activating a first access line 110 and a second access line 115.

In some examples, the memory controller 150 may control the operation (e.g., read operations, write operations, rewrite operations, refresh operations, discharge operations) of memory cells 105 through the various components (e.g., row decoder 125, column decoder 135, sense component 130). In some cases, one or more of the row decoder 125, column decoder 135, and sense component 130 may be co-located or otherwise included with the memory controller 150. The memory controller 150 may generate row and column address signals to activate a desired access line 110 and access line 115. The memory controller 150 may also generate or control various voltages or currents used during the operation of memory device 100. For example, the memory controller 150 may apply a discharge voltage to an access line 110 or an access line 115 after accessing one or more memory cells 105.

In general, the amplitude, shape, or duration of an applied voltage, current, or charge may be adjusted or varied, and may be different for the various operations discussed in operating the memory device 100. Further, one, multiple, or all memory cells 105 within memory device 100 may be accessed simultaneously. For example, multiple or all memory cells 105 of memory device 100 may be accessed simultaneously during a reset operation in which all memory cells 105, or a group of memory cells 105, are set to a single logic state.

A memory cell 105 may be read, or sensed, by a sense component 130. For example, sense component 130 may be configured to determine the stored logic state of a memory cell 105 based on a signal generated by accessing the memory cell 105. The signal may include a voltage, an electrical charge, an electrical current, or a combination thereof, and sense component 130 may include voltage sense amplifiers, charge sense amplifiers, current sense amplifiers, or both.

In some examples, a threshold current may be defined for sensing the logic state stored by a memory cell 105. The threshold current may be set above a current that may pass through the memory cell 105 when the memory cell 105 does not threshold in response to the read pulse, but equal to or below an expected current through the memory cell 105 when the memory cell 105 does threshold in response to the read pulse. For example, the threshold current may be higher than a leakage current of the associated access lines 110 or 115. In some examples, a logic state stored by a memory cell 105 may be determined based on a voltage (e.g., across a shunt resistance) resulting from the current driven by a read pulse. For example, the resulting voltage may be compared relative to a reference voltage, with a resulting voltage less than the reference voltage corresponding to a first logic state and a resulting voltage greater than the reference voltage corresponding to a second logic state.

A sense component 130 may include various switching components, selection components, transistors, amplifiers, capacitors, resistors, or voltage sources to detect and amplify a difference in sensing signals (e.g., a difference between a read voltage and a reference voltage, a difference between a read current and a reference current, a difference between a read charge and a reference charge), aspects of which, in some examples, may be referred to as latching. In some examples, a sense component 130 may include a collection of components (e.g., circuit elements) that may be repeated for each of a set of access lines 115 connected to the sense component 130. For example, a sense component 130 may include a separate sensing circuit (e.g., a separate sense amplifier, a separate signal development circuit) for each of a set of access lines 115 coupled with the sense component 130, such that a logic state may be separately detected for a respective memory cell 105 coupled with a respective one of the set of access lines 115. In various examples, a reference signal source or generated reference signal may be shared between components of the memory device 100 (e.g., shared among one or more sense components 130, shared among separate sensing circuits of a sense component 130).

The sense component 130 may be included in a device that includes the memory device 100. For example, the sense component 130 may be included with other read and write circuits, decoding circuits, or register circuits of the memory that may be coupled to the memory device 100. In some examples, the detected logic state of a memory cell 105 may be output through a column decoder 135 as an output. In some examples, a sense component 130 may be part of a column decoder 135 or a row decoder 125. In some examples, a sense component 130 may be connected to or otherwise in electronic communication with a column decoder 135 or a row decoder 125.

Although a single sense component 130 is shown, a memory device 100 may include more than one sense component 130. For example, a first sense component 130 may be coupled with a first subset of access lines 115 and a second sense component 130 may be coupled with a second subset of access lines 115 (e.g., different from the first subset of access lines 115). In some examples, such a division of sense components 130 may support parallel (e.g., simultaneous) operation of multiple sense components 130. In some examples, such a division of sense components 130 may support matching sense components 130 having different configurations or characteristics to particular subsets of the memory cells 105 of the memory device (e.g., supporting different types of memory cells 105, supporting different characteristics of subsets of memory cells 105, supporting different characteristics of subsets of access lines 115).

Additionally or alternatively, two or more sense components 130 may be coupled with a same set of access lines 115 (e.g., for component redundancy). In some examples, such a configuration may support maintaining functionality to overcome a failure or otherwise poor operation of one of the redundant sense components 130. In some examples, such a configuration may support the ability to select one of the redundant sense components 130 for particular operational characteristics (e.g., as related to power consumption characteristics, as related to access speed characteristics for a particular sensing operation).

In ferroelectric memory architectures accessing the memory cell 105 may degrade or destroy the stored logic state and re-write or refresh operations may be performed to return the original logic state to memory cell 105. In DRAM or FeRAM, for example, a capacitor of a memory cell 105 may be partially or completely discharged during a sense operation, thereby corrupting the logic state that was stored in the memory cell 105. Thus, in some examples, the logic state stored in a memory cell 105 may be rewritten after an access operation. Further, activating a single access line 110 or 115 may result in the discharge of all memory cells 105 coupled with the access line 110 or 115. Thus, several or all memory cells 105 coupled with an access line 110 or 115 of an access operation (e.g., all cells of an accessed row, all cells of an accessed column) may be rewritten after the access operation.

A ferroelectric memory element (e.g., a ferroelectric capacitor) of a memory cell 105 may written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage may be applied across the ferroelectric memory element (e.g., grounding, virtually grounding the ferroelectric memory element).

Figure 2:
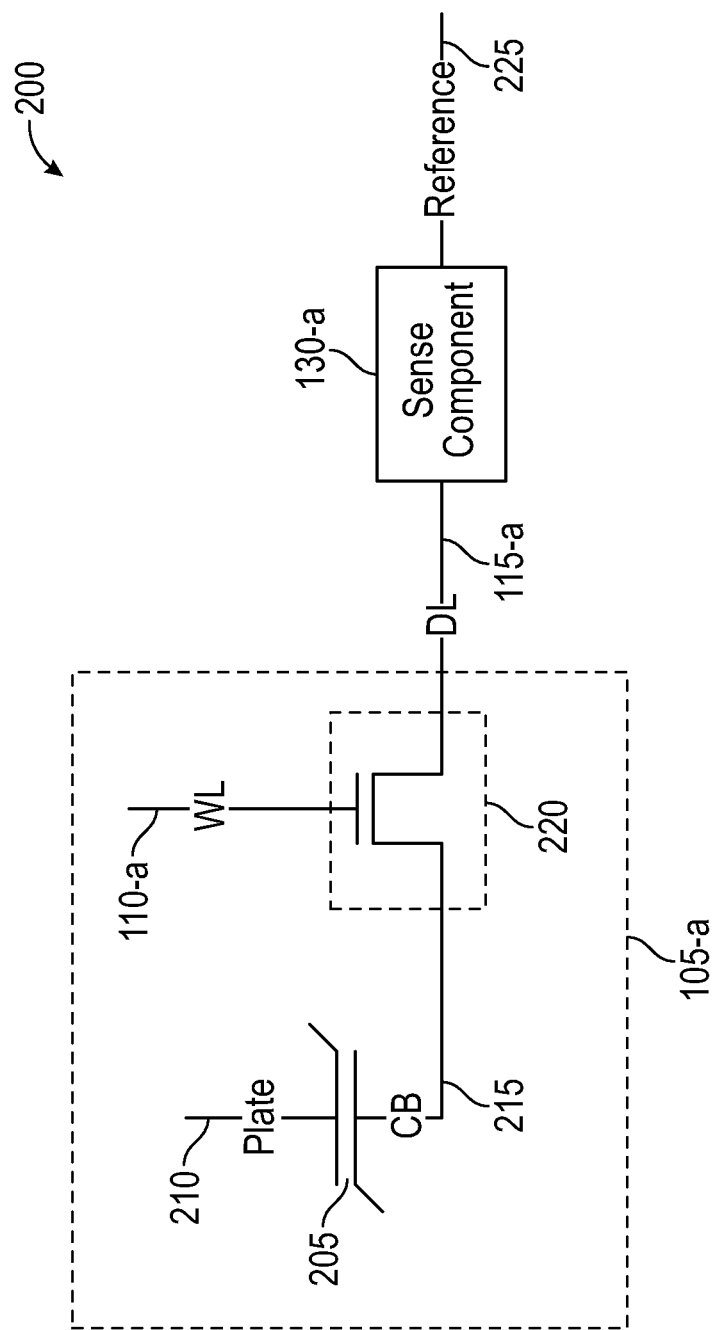
FIG. 2 illustrates an example circuit of a memory cell for supporting memory cell access in accordance with some examples of the present disclosure.

FIG. 2 illustrates an example circuit 200 for memory access in accordance with various embodiments of the present disclosure. Circuit 200 may include a ferroelectric memory cell 105-a, word line 110-a, digit line 115-a, and sense component 130-a, which may be examples of a memory cell 105, word line 110, digit line 115, and sense component 130, respectively, as described with reference to FIG. 1. Circuit 200 includes a logic storage component, such as capacitor 205 that includes two conductive terminals, cell plate 210 and cell bottom 215. These terminals may be separated by an insulating ferroelectric material. As described above, various states may be stored by charging or discharging capacitor 205. The cell plate line 210 can correspond to the plate lines 120 (FIG. 1).

The stored state of capacitor 205 may be read or sensed by operating various elements represented in circuit 200. Capacitor 205 may be in electronic communication with digit line 115-a. Capacitor 205 may thus be isolated from the digit line 115-a when selection component 220 is deactivated, and capacitor 205 may be connected to digit line 115-a via selection component 220 when selection component 220 is activated. In some cases, selection component 220 may be a transistor and its operation may be controlled by applying a voltage to the transistor gate, where the voltage magnitude is greater than the threshold magnitude of the transistor. Word line 110-a may activate selection component 220; for example, a voltage applied to word line 110-a may be applied to the transistor gate, connecting capacitor 205 with digit line 115-a.

In the example depicted in FIG. 2, capacitor 205 is a ferroelectric capacitor. The change in stored charge depends on the initial state of capacitor 205, i.e., if the initial state stored a logic 1 or a logic 0. The change in stored charge may then be compared to a reference (e.g., a reference voltage) by sense component 125-a in order to determine the stored logic state in memory cell 105-a. To write memory cell 105-a, a voltage potential may be applied across capacitor 205.

Figure 3:
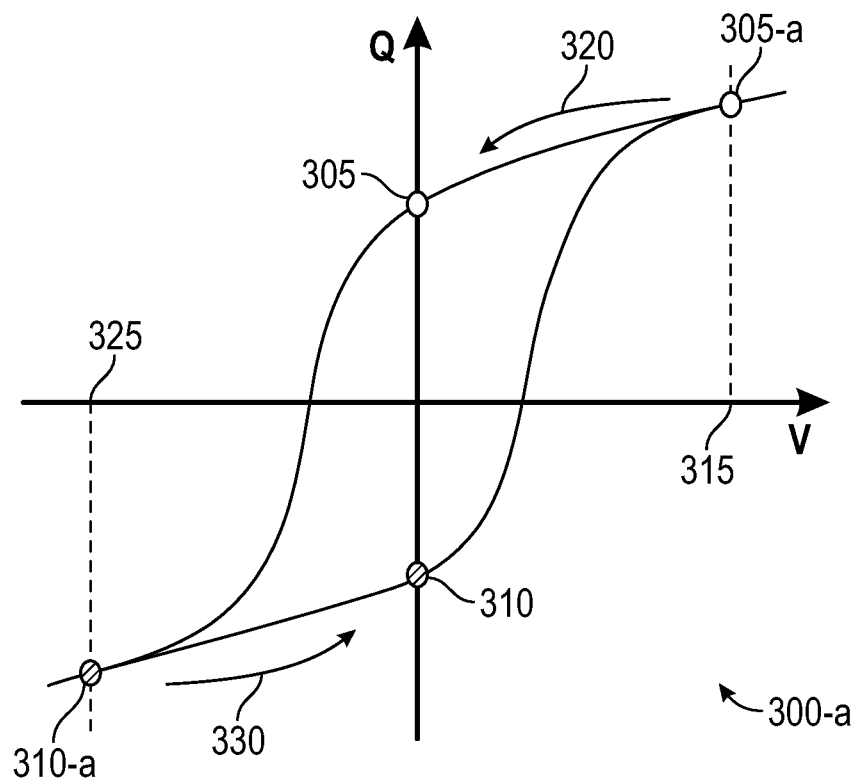
FIG. 3 illustrates examples of non-linear electrical properties with hysteresis plots for a ferroelectric memory cell sensing in accordance with examples of the present disclosure.
Figure 3:
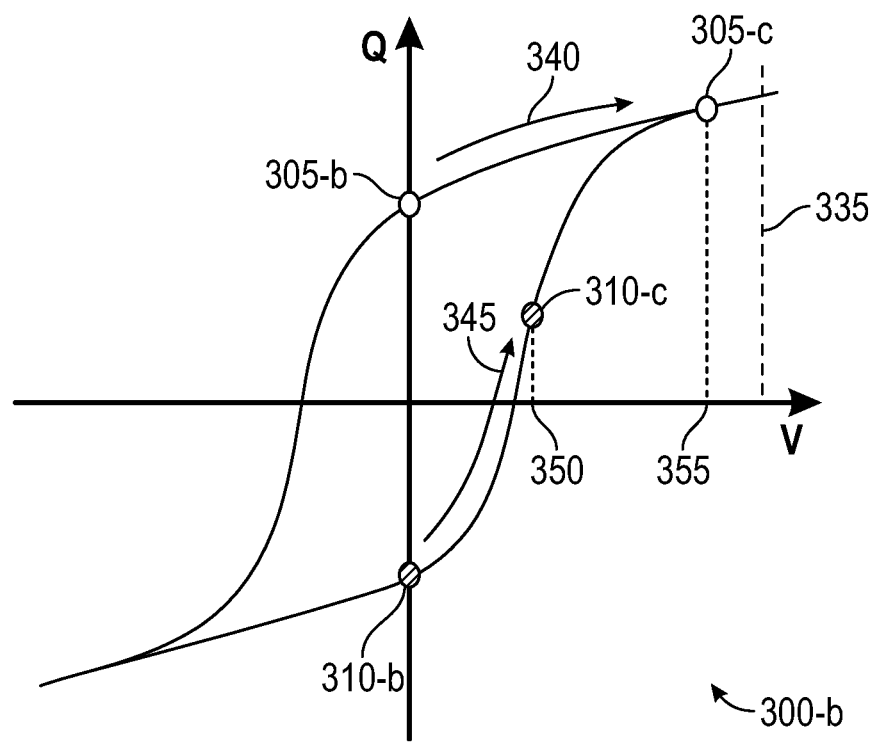

As discussed above, ferroelectric memory may require two pairs of operations to complete a read and write function. FIG. 3 illustrates examples of non-linear electrical properties with hysteresis plots for a ferroelectric memory cell sensing in accordance with examples of the present disclosure. Hysteresis curves 300-a and 300-b illustrate an example ferroelectric memory cell writing and reading process, respectively. Hysteresis curves 300 depict the charge, Q, stored on a ferroelectric capacitor as a function of a voltage difference, V.

A ferroelectric material is characterized by a spontaneous electric polarization, for example, it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in volatile memory arrays. This may reduce the need to perform refresh operations as described above for some volatile memory architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question and maintaining the second terminal at ground (or approximately zero volts (0V)). A negative voltage may be applied by maintaining the terminal in question at ground and applying a positive voltage to the second terminal, for example, positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero-voltage difference, resulting in two possible charged states: charge state 305-a and charge state 310-a. According to the example of FIG. 3, charge state 305 represents a logic 0 and charge state 310 represents a logic 1. In some examples, the logic values of the respective charge states may be reversed without loss of understanding.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage. In some example aspects, after sensing, stored data in a cell is destroyed (e.g., written to "0" regardless of the original data). Accordingly, if a "0" is to be programmed into the cell, no further action is needed. However, if a "1" is to be programmed into the cell, then writing a "1" as described above may occur.

To read, or sense, the stored state of the ferroelectric capacitor, a voltage may be applied across the capacitor. In response, the stored charge changes, and the degree of the change depends on the initial charge state—i.e., the degree to which the stored charge of the capacitor changes varies depending on whether charge state 305-b or 310-b was initially stored. For example, hysteresis curve 300-b illustrates two possible stored charge states 305-b and 310-b. Net voltage 335 may be applied across the capacitor. Although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing operation and circuitry.

In some cases, the final charge may depend on the intrinsic capacitance of the digit line of a memory cell. For example, if the capacitor is electrically connected to the digit line and voltage 335 is applied, the voltage of the digit line may rise due to its intrinsic capacitance. Therefore, a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis, i.e., charge states 305-c and 310-c may be defined with respect to the digit line capacitance. As a result, the voltage of the capacitor, voltage 350 or voltage 355, may be different and may depend on the initial state of the capacitor. By comparing voltage 350 or voltage 355 to a reference voltage, the initial state of the capacitor may be determined. For example, the reference voltage may be an average of voltage 350 and 355 and, upon comparison, the sensed voltage may be determined to be higher or lower than the reference voltage. A value of the ferroelectric cell (i.e., a logic 0 or 1) may then be determined based on the comparison.

Figure 4A:
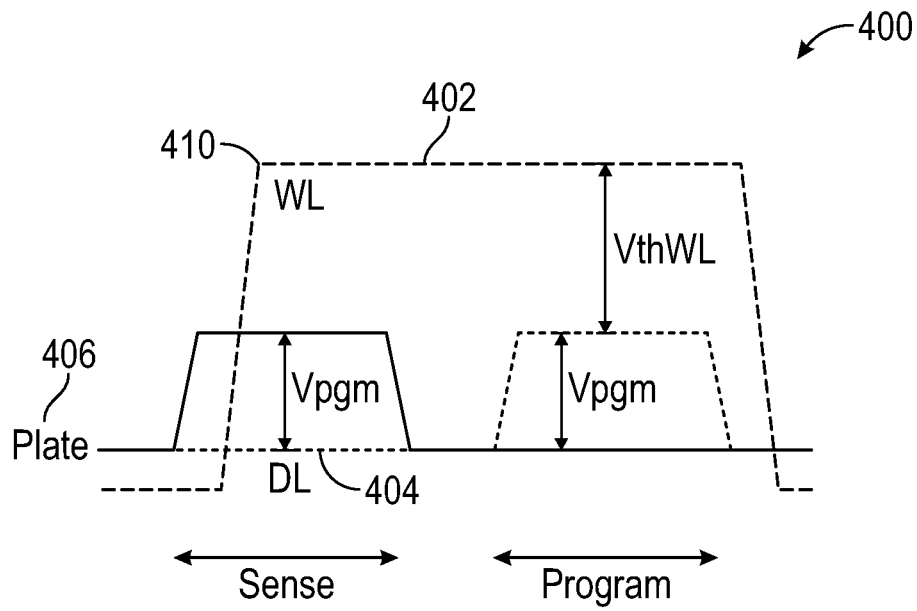
FIGS. 4A and 4B illustrate example timing diagrams supporting memory cell sensing and programming according to available systems.
Figure 4B:
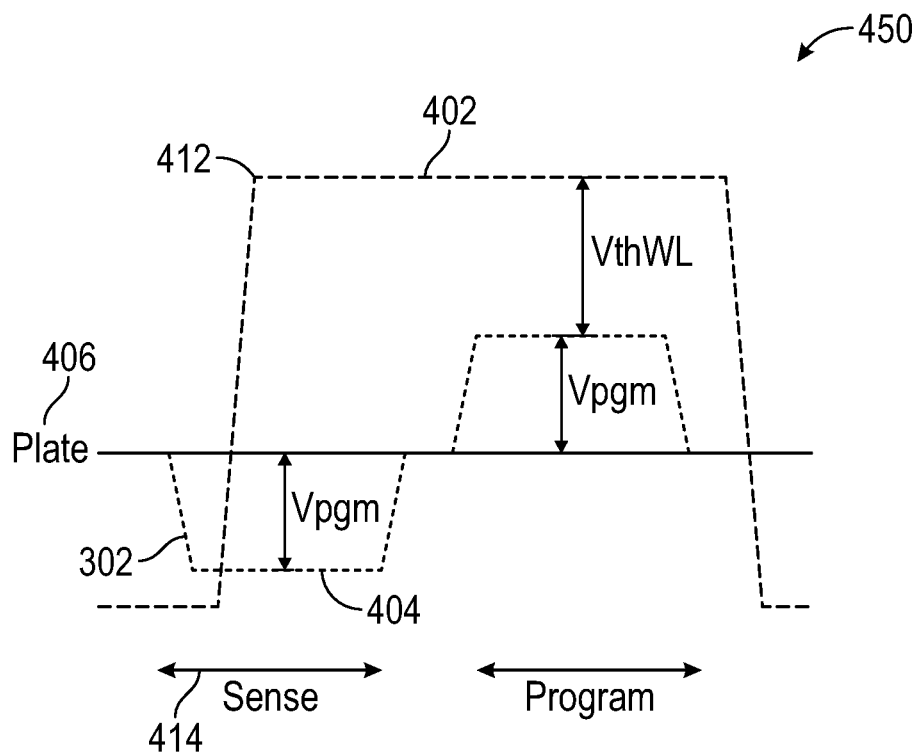

As mentioned earlier herein, access lines (e.g., word lines (WL), digit lines (DL) and plate lines (PL)) can be charged to different voltages relative to each other in different sequences to perform sensing and programming operations. FIGS. 4A and 4B illustrate example timing diagrams 400, 450 for example memory cell voltages in a memory cell (e.g., memory cell 105 of FIG. 1 or FIG. 2) according to available systems. Time is depicted horizontally and voltage vertically, such that the voltage of various components is depicted as a function of time. Timing diagrams 400, 450 may correspond to the operation of one or more components described above with reference to FIGS. 1 and 2. For example, timing diagrams 400, 450 may include discussion of a memory cell 105, signal 402 can represent voltage of first access lines 110 (e.g., a word line (WL)), signal 404 can represent voltage of second access lines 115 (e.g., a digit line (DL)), and signal 406 can represent voltage of plate lines 120 as described with reference to FIG. 1. Various outputs of the row decoder 125, column decoder 135, sense component 130 and memory controller 150 may also be utilized in generation of and discussion of the diagrams 400, 450.

Referring first to FIG. 4A in conjunction with the memory device of FIG. 1, the PL 120 is pulsed during sensing and programming between a low value and a program voltage $V_{pgm}$. After the WL 110 goes high at time 410, the charge stored in the addressed memory cell 105 is dumped to the DL 115. Voltage at the PL 120 is higher than at DL 115 so there is voltage across the memory cell 105. During programming, the signal 406 (at PL 120) is low and the signal at 404 high relative to PL 110. The power, which is used to pulse the PL 110 high and low, can result in excessive or relative high power usage.

FIG. 4B represents a fixed PL method meant to address the concerns of high power usage described with reference to FIG. 4A. In the example of FIG. 4B, a plate voltage may remain fixed at a certain value, such as 1.8 V for example. A word line (e.g., WL 110 (FIG. 1) voltage may rise at time 412. The digit line (e.g., DL 115) goes to negative or positive at a constant (or near constant or substantially constant) rate. Memory cells that operate as such a fixed plate voltage may have less overhead related to moving plate voltage and may not require a bifurcated write back. However, such a fixed plate voltage may be significantly higher than plate voltages of DRAM (e.g., 1.8 V for the example of FIG. 4B versus 0.6 V for many DRAM architectures). Such higher voltages may result in larger and/or slower devices that have relatively high power consumption.

Furthermore, particularly during sensing operation 414, resulting in WL-to-DL leakage (on the order of tens or hundreds of nano Amperes (nA), or about 100 nA) and reduced sensitivity. The leakage can also limit the highest available WL voltage (from an ideal of about 5 volts to a maximum of 4.8 volts) and can limit the maximum $V_{pgm}$ at which the memory device 100 can operate.

This leakage issue is illustrated with reference to FIGS. 5A-5D.

Figure 5A:
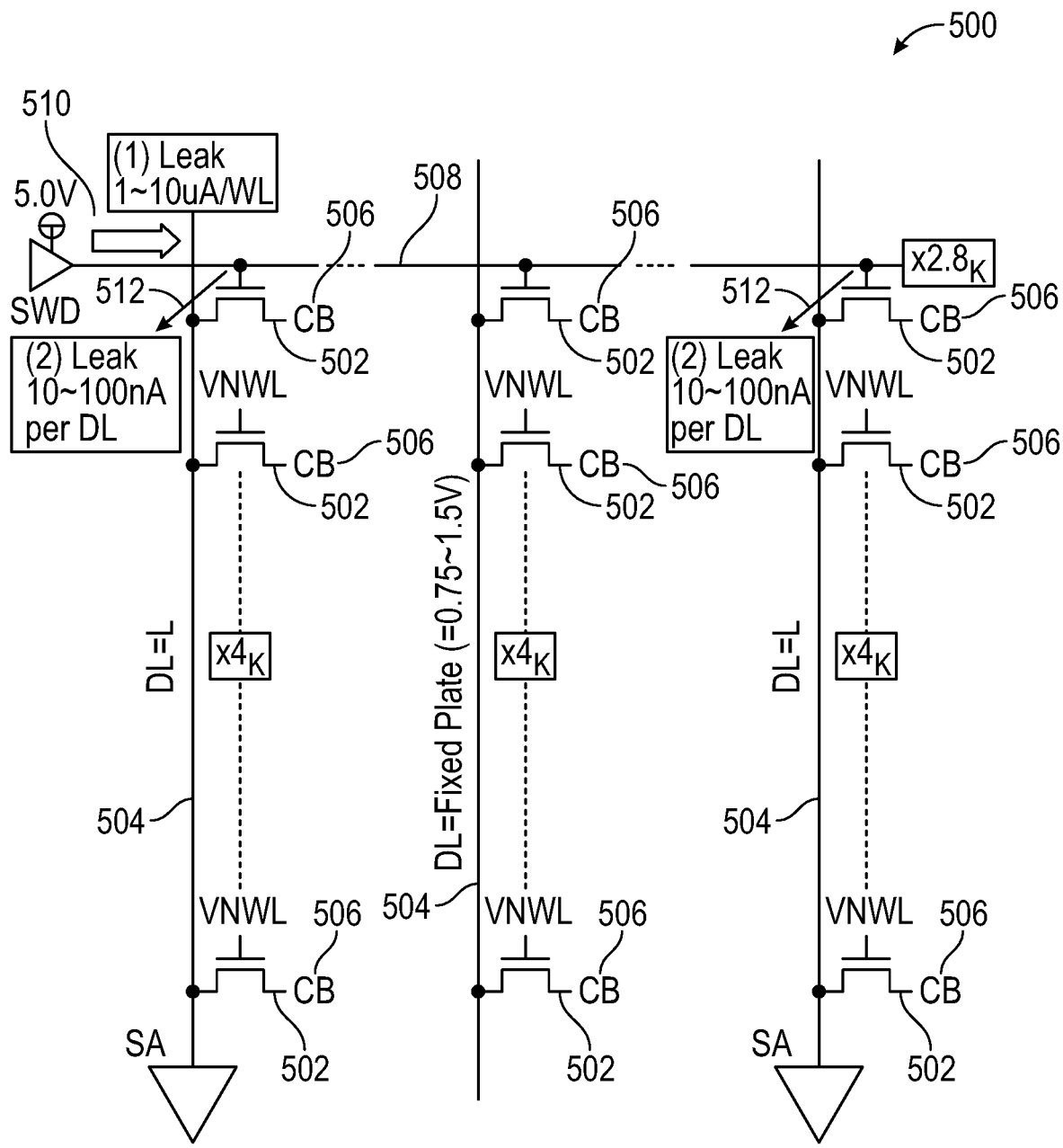
FIG. 5A illustrates a partial circuit diagram for illustrating voltage leakage that can occur in an available fixed plate scheme for memory cell sensing and programming.

FIG. 5A illustrates a partial circuit diagram 500 for illustrating voltage leakage that can occur in an available fixed plate scheme for memory cell sensing and programming Some components shown in FIG. 5A can be the same or similar to components shown in FIG. 1 and FIG. 2 and are numbered accordingly. For example, selector transistors 502 can be similar to transistor 220 (FIG. 2). Digit lines 504 can be similar to digit lines 115 (FIG. 1 and FIG. 2). Cell bottoms 506 can be similar to cell bottom 215 (FIG. 2). Word line 508 can be similar to WL 110 (FIG. 1 and FIG. 2). While three-digit lines 504 and one word line 508 are shown in the partial circuit diagram 500, it will be appreciated that any number of word lines and digit lines, and corresponding transistors 502, etc., can be included similarly to the memory device 100 described above with reference to FIG. 1 and FIG. 2. Leakage 510 can occur at each word line 508. For example, a leakage of 1-10 microamperes can occur at each word line caused by gate oxide tunnel leakage current on the selected selector devices. A further leakage 512 can occur for each digit line 504 caused by gate induced drain leakage (GIDL) through all unselected selector devices. For example, a leakage of about 10-100 nanoamps can occur from each word line 508 to each digit line 504 coupled to a respective word line.

Figure 5B:
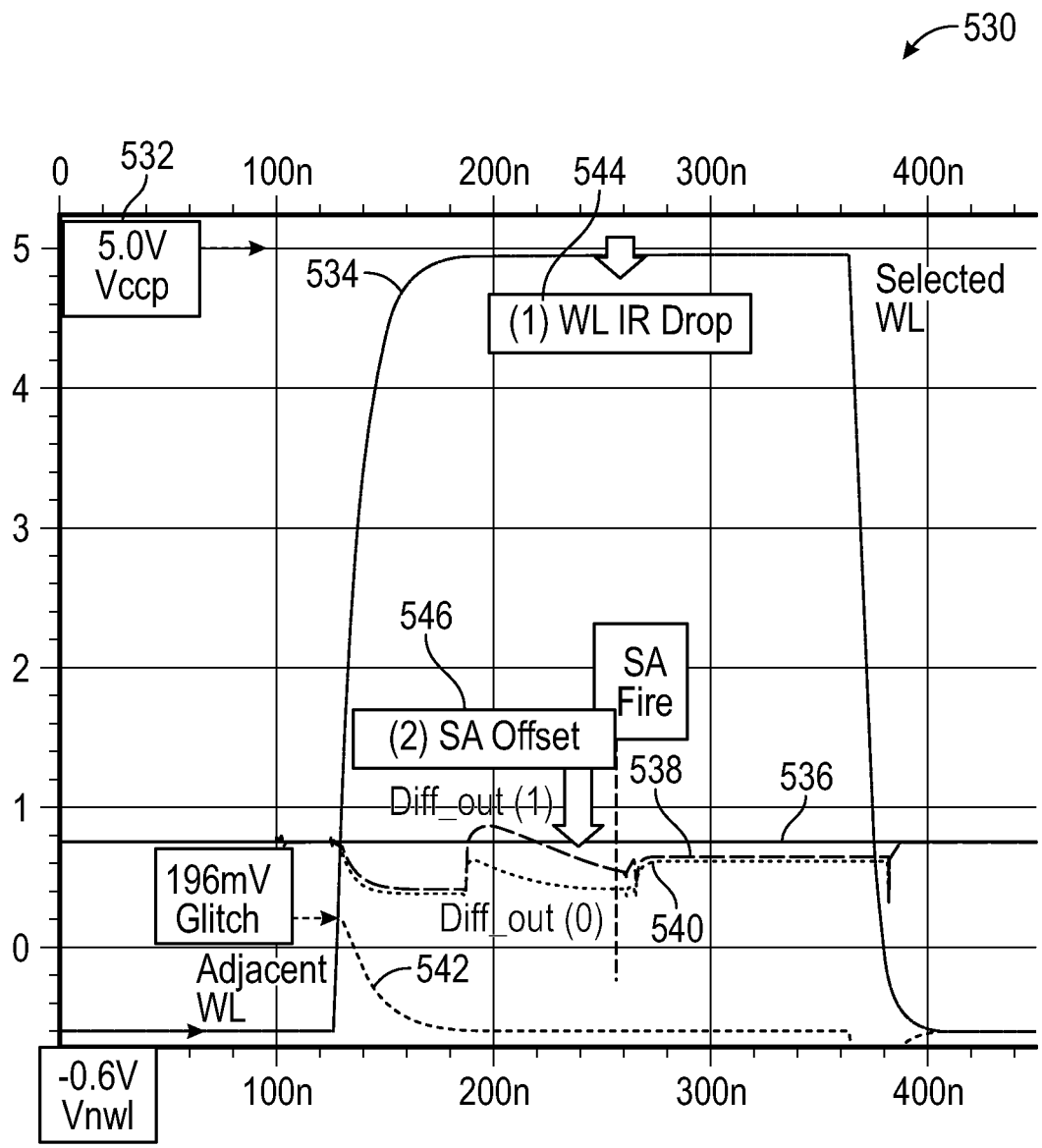
FIG. 5B illustrates a simulation waveform showing voltage leakage that can occur in an available fixed plate scheme for memory cell sensing and programming.

FIG. 5B illustrates a simulation waveform 530 showing voltage leakage that can occur in an available fixed plate scheme for memory cell sensing and programming Curve 532 illustrates supply voltage, typically 5 volts. Curve 534 illustrates voltage (relative to the fixed plate) of a selected word line (e.g., a word line 508 (FIG. 5A)) and curve 536 illustrates fixed plate voltage. Curve 538 illustrates a first output of a sensing amplifier (e.g., an amplifier of a sense component 125 (FIG. 1 and FIG. 2) and curve 540 represents a second output of the sensing amplifier. Curve 542 illustrates voltage of a word line adjacent to the selected word line. Curve 534 ideally would be at 5V without leakage, but due to leakage (similar to leakage 510 (FIG. 5A) from the selected word line to corresponding digit lines, an offset 544 can occur between the supply voltage and the maximum voltage of the selected word line. Similarly, a sensor amplifier offset 546 can occur due to the leakage (e.g., leakage 512 (FIG. 5A) from a word line to corresponding digit lines.

Figure 5C:
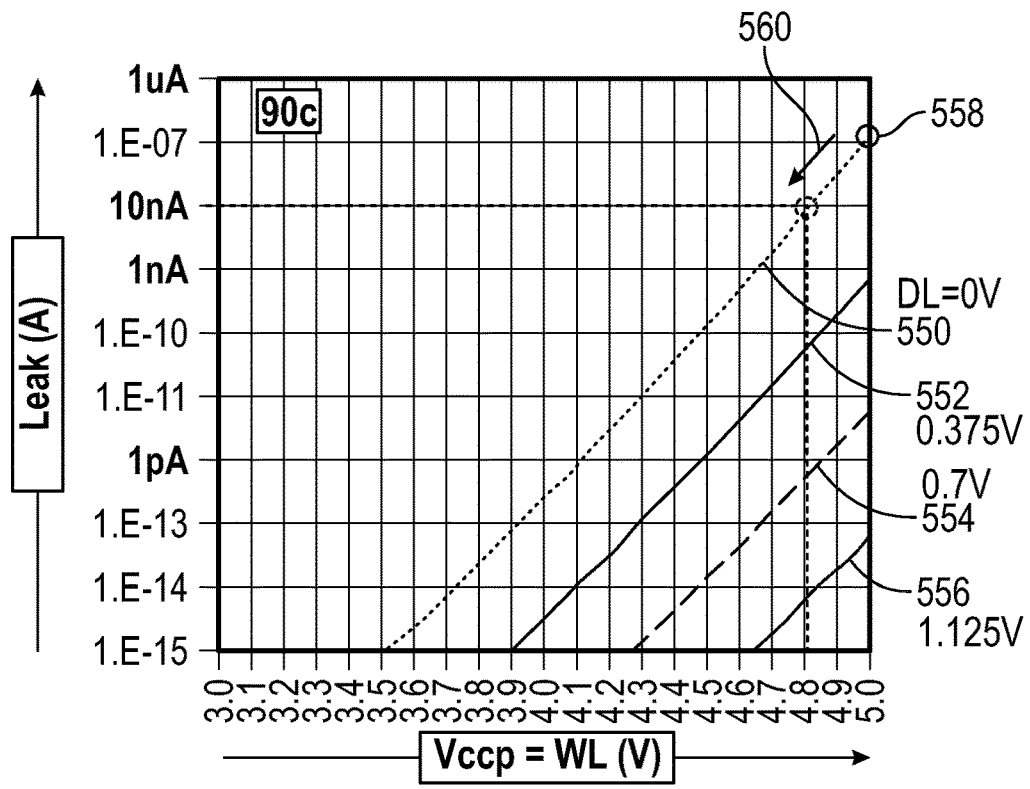
FIG. 5C illustrates sensor amplifier leakage that can occur in an available fixed plate scheme for memory cell sensing and programming.

FIG. 5C illustrates sensor amplifier leakage that can occur in an available fixed plate scheme for memory cell sensing and programming Curve 550 represents word line voltage when a corresponding digit line is at about 0 volts. Curve 550 represents word line voltage when a corresponding digit line is at about 0 volts absolute voltage or about −1.5 volts relative to plate voltage. Curve 552 represents word line voltage when a corresponding digit line is at about 0.375 volts. Curve 554 represents word line voltage when a corresponding digit line is at about 0.7 volts. Curve 556 represents word line voltage when a corresponding digit line is at about 1.125 volts. As can be seen in FIG. 5C, leakage is smaller with increased voltage of the digit line. As shown in FIG. 5C, leakage can be up to about 10 nanoamperes, when a corresponding digit line is at about 0 volts. Point 558 illustrates a preferred maximum voltage (e.g., 5V) to show that leakage 560 can result in reduced maximum $V_{pgm}$ according to fixed plate schemes.

Figure 5D:
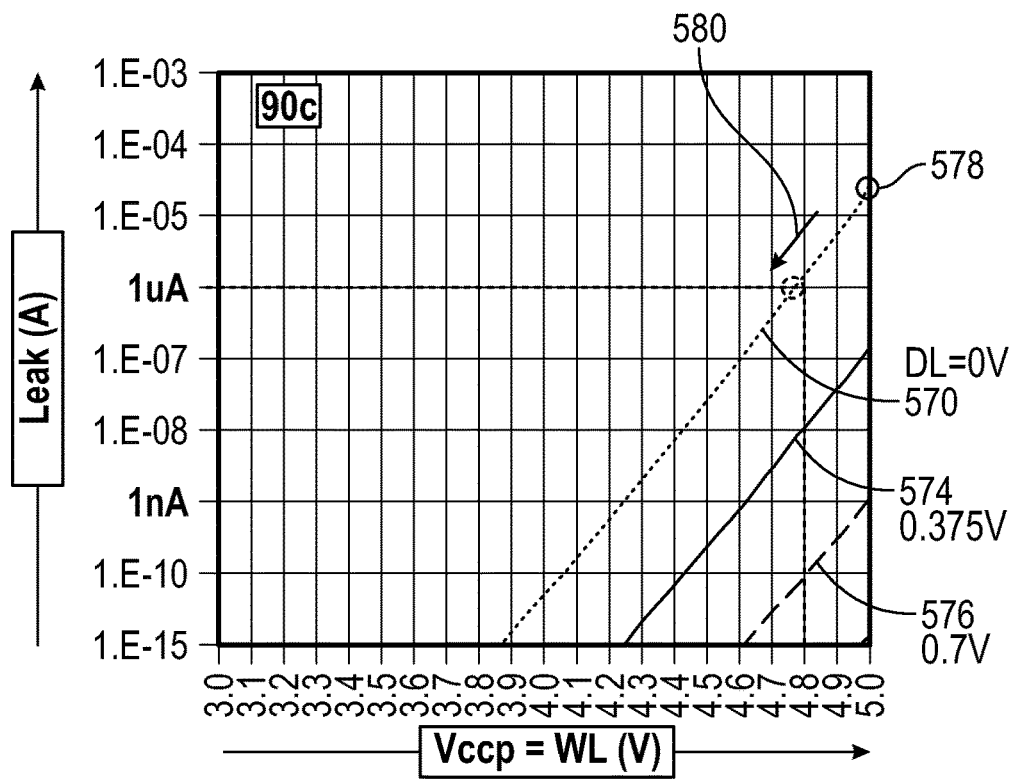
FIG. 5D illustrates word line maximum voltage drop that can occur in an available fixed plate scheme for memory cell sensing and programming.

FIG. 5D illustrates word line maximum voltage drop that can occur in an available fixed plate scheme for memory cell sensing and programming Curve 570 represents word line voltage when a corresponding digit line is at about 0 volts. Curve 574 represents word line voltage when a corresponding digit line is at about 0.375 volts. Curve 576 represents word line voltage when a corresponding digit line is at about 0.7 volts. As can be seen in FIG. 5D, leakage is smaller with increased voltage of the digit line. As shown in FIG. 5D, leakage can be up to about 1 microampere, when a corresponding digit line is at about 0 volts. Point 578 illustrates a preferred maximum voltage (e.g., 5V) to show that leakage 580 can result in reduced maximum Vpgm according to fixed plate schemes.

Systems, methods and apparatuses according to aspects address these and other concerns by reducing voltage differences between access lines as described below, while maintaining a fixed-plate scheme to take advantage of simplicity described above with reference to FIG. 4B. Systems, methods and apparatuses according to aspects can reduce WL-to-DL leakage by about 90% or even further, to about 10 nA or even less leakage.

Figure 6:
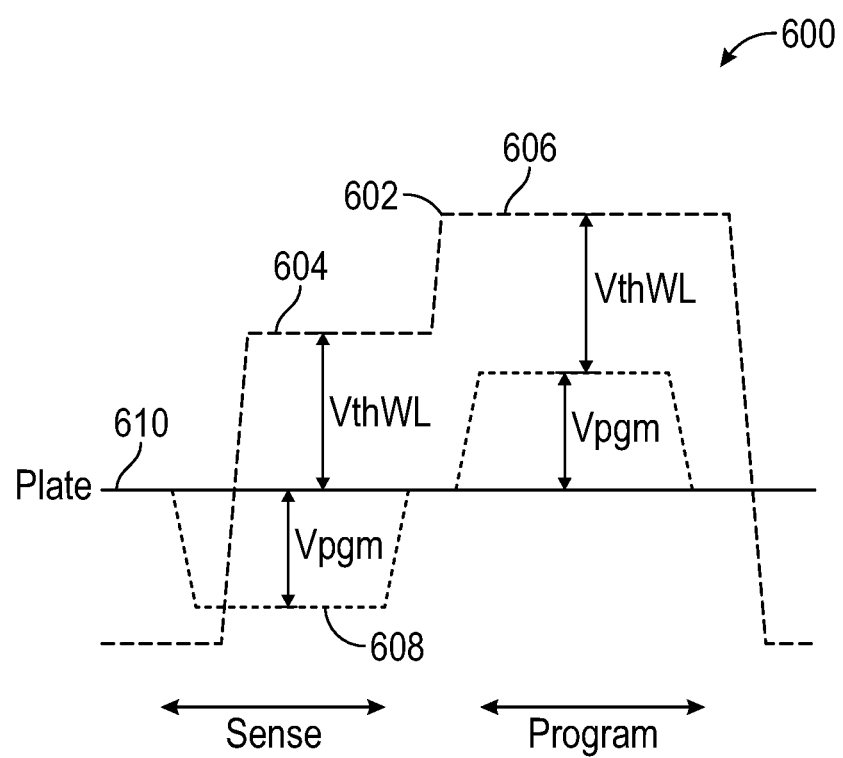
FIG. 6 illustrates an example timing diagram supporting memory cell sensing and programming in accordance with aspects of the present disclosure.

FIG. 6 illustrates a timing diagram 600 for example memory cell voltages in a memory cell (e.g., memory cell 105 of FIG. 1 or FIG. 2) according to example aspects of the disclosure. Similarly to FIGS. 4A and 4B, time is depicted horizontally and voltage vertically, such that the voltage of various components are depicted as a function of time. Timing diagram 600 may correspond to the operation of one or more components described above with reference to FIGS. 1 and 2. Voltages are described with reference to selected DLs, and voltages for unselected DLs can be different and are outside the scope of the disclosure.

According to aspects, the WL 110 signal 602 is pulsed in two steps, as seen at step 604 and step 606. During the first step 604 (performed for example during a sensing phase, wherein a sensing phase can be similar to that discussed above with respect to FIG. 2), the voltage at WL 110 equals about $V_{pgm}+Vt_hWL$, (as seen relative to signal 608) wherein $V_{pgm}$ can be about 3 volts and the voltage at the WL 110 can be bout 3.2 volts, where $Vt_hWL$, represents threshold voltage of the selector device. This voltage is sufficient to turn on WL 110 during sensing because DL 115 is at a low voltage as seen at signal 608. Plate voltage is maintained at a constant voltage (e.g., about 1.5 volts) as seen at signal 610.

Higher voltages may be needed at the word line 110 during programming. Accordingly, during the second step 606, WL 110 is stepped up to $V_{pgm}+V_{pgm}+Vt_hWL$. During the second step 606, an unselected DL 115 will be at about $V_{pgm}$ and a selected DL will be at about $V_{pgm}+V_{pgm}$. The second step 606 can correspond to a programming phase, similarly to a programming phase discussed above with reference to FIG. 2).

Overall, the maximum voltage of the WL 110 can be similar to that shown in FIG. 4B during programming, or about $Vt_hWL$, $V_{pgm}$, but as the DL voltage is slightly higher than that shown in FIG. 4B, there can be slightly less leakage during programming. However, leakage can be further lessened during sensing, given the lower word line 110 voltage during step 606. Because sensing can be a more sensitive operation than programming, and thereby less tolerant to leakage, word line voltage 110 can be about $Vt_hWL$, which is less than the maximum word line voltage seen in the fixed-plate scheme illustrated in FIG. 4B.

Referring again to FIG. 2 in conjunction with FIG. 6, leakage of the switch (e.g., transistor) 220 may be more important during sensing than during programming, due to the sensitivity of sensing operations. Reduced gate voltage can be useful during sensing in order to not disturb the sensing itself. In contrast, during programming leakage is less important to the memory cell operation. As seen in FIG. 2, the selector transistor 220 includes a gate coupled to the WL 110 and another terminal coupled to the DL 115. During sensing, (e.g., step 604 in FIG. 6), the voltage difference between the WL and DL is reduced relative to a fixed-plate scheme (FIG. 4B). Accordingly, a high voltage (e.g., about 5V) is not maintained across the transistor 220 for an extended period of time (e.g., throughout both sensing and programming operations) as it is with the fixed-plate scheme. Instead, the voltage across the transistor 220 may not exceed an intermediate voltage of the transistor 220, or about 3-3.2 volts. The transistor device 220 can accordingly be designed to consider intermediate voltages, rather than high voltages, which in turn can improve longevity of the transistor 220 and provide for a less complex design of the transistor device 220 and surrounding circuitry.

Figure 7:
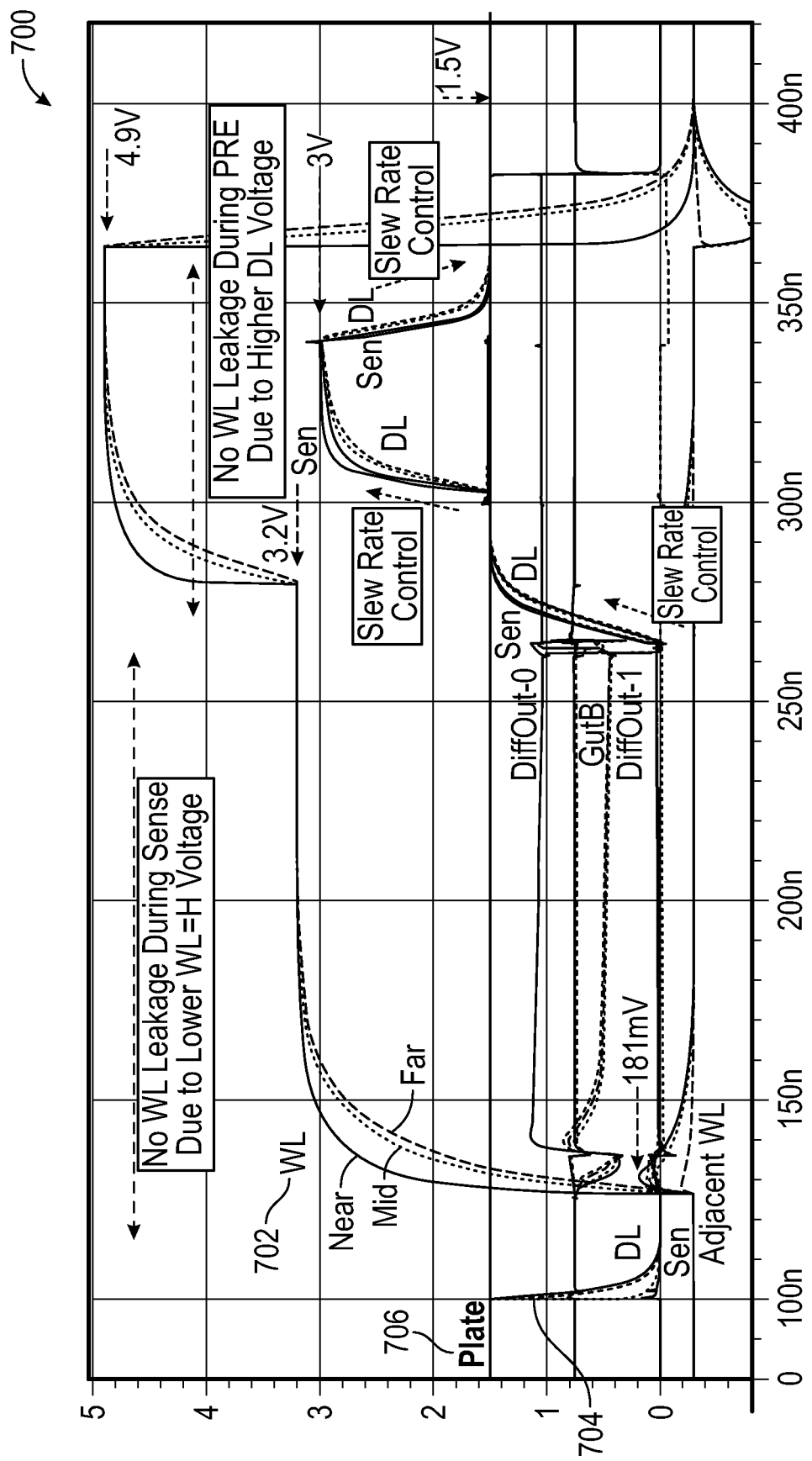
FIG. 7 illustrates a simulation waveform showing access line waveforms according to a fixed plate scheme in accordance with various aspects of the present disclosure.

FIG. 7 illustrates a simulation waveform 700 showing access line waveforms according to a fixed plate scheme in accordance with various aspects of the present disclosure. The waveform 700 may correspond to the operation of one or more components described above with reference to FIGS. 1 and 2. For example, waveform 700 may include discussion of a memory cell 105, waveform 702 can represent voltage of first access lines 110 (e.g., a word line (WL)), waveform 704 can represent voltage of second access lines 115 (e.g., a digit line (DL)), and signal 706 can represent voltage of plate lines 120 as described with reference to FIG. 1. Various outputs of the row decoder 125, column decoder 135, sense component 130 and memory controller 150 may also be utilized in generation of and discussion of the waveform 700.

Referring also to FIG. 6, during a sensing operation, waveform 704 can be low (e.g., below plate voltage or signal 706), and waveform 702 (e.g., WL 110) can be stepped up in a first step similarly to step 604 (FIG. 6). During the sense operation, WL leakage can be reduced or eliminated due to the lower WL 110 voltage relative to FIG. 4B. During a programming operation, waveform 704 can be increased, and waveform 702 can be further increased in a step similar to step 606 (FIG. 6). Here leakage is also reduced due to the higher relative DL 115 voltage compared to FIG. 4B.

Figure 8:
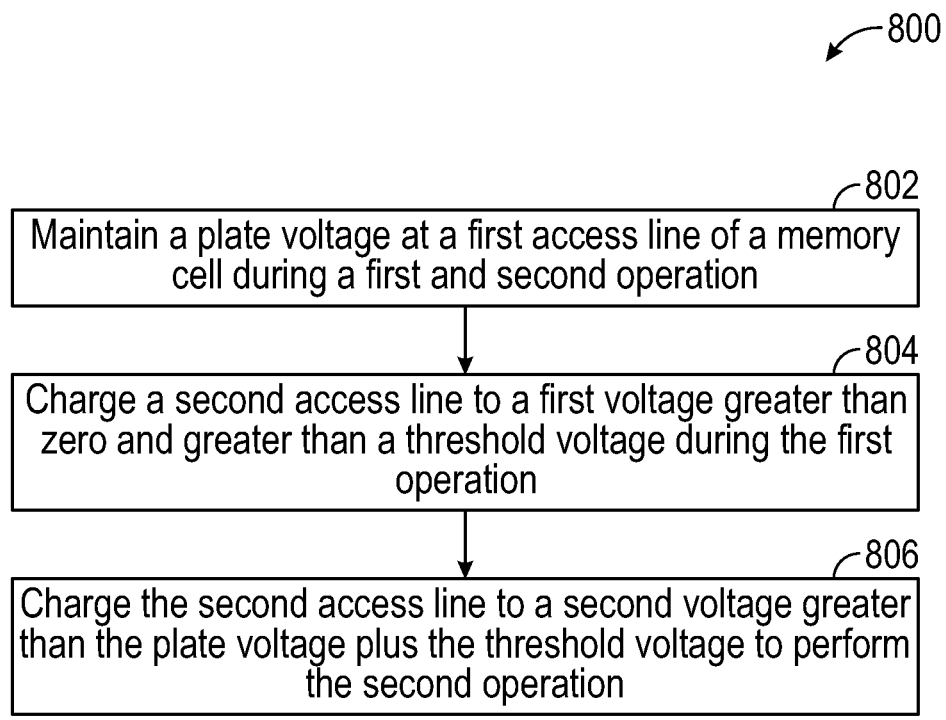
FIG. 8 illustrates a flow diagram that supports memory cell sensing in accordance with aspects of the present disclosure.

FIG. 8 illustrates a method 800 that supports memory cell sensing in accordance with aspects of the present disclosure. The method 800 can be performed by components described above with reference to FIG. 1 and FIG. 2. For example, some operations can be performed by a memory controller 150, sense component 130, with respect to WL 110, PL 120, and DL 115 of memory cell 105.

The method 800 can begin with operation 802 with the memory controller 150 or sense component 130 maintaining a plate voltage at a first access line (e.g., PL 120) of a memory cell 105 during at least a first operation and a second operation of the memory cell 105.

The method 800 can continue with operation 804 with the memory controller 150 or sense component 130 charging a second access line (e.g., WL 110) to a first voltage greater than zero and greater than a threshold voltage of a selector device of the memory cell during the first operation on the memory cell.

The method 800 can continue with operation 806 with the memory controller 150 or sense component 130 charging the second access line (e.g., WL 110) to a second voltage greater than the plate voltage plus the threshold voltage of the selector device to perform the second operation of the memory cell.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one aspect", "an aspect", "an example aspect", "some aspects", "demonstrative aspect", "various aspects" etc., indicate that the aspect(s) so described may include a particular feature, structure, or characteristic, but not every aspect necessarily includes the particular feature, structure, or characteristic. Further, repeated use of the phrase "in one aspect" does not necessarily refer to the same aspect, although it may.

As used herein, unless otherwise specified the use of the ordinal adjectives "first", "second", "third" etc., to describe a common object, merely indicate that different instances of like objects are being referred to and are not intended to imply that the objects so described must be in a given sequence, either temporally, spatially, in ranking, or in any other manner.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting and/or the action of receiving. In one example, the phrase "communicating a signal" may refer to the action of transmitting the signal by a first device and may not necessarily include the action of receiving the signal by a second device. In another example, the phrase "communicating a signal" may refer to the action of receiving the signal by a first device and may not necessarily include the action of transmitting the signal by a second device.

As used herein, the term "circuitry" may, for example, refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some aspects, circuitry may include logic, at least partially operable in hardware. In some aspects, the circuitry may be implemented as part of and/or in the form of a radio virtual machine (RVM), for example, as part of a Radio processor (RP) configured to execute code to configured one or more operations and/or functionalities of one or more radio components.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g., radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and/or the like. Logic may be executed by one or more processors using memory, e.g., registers, buffers, stacks, and the like, coupled to the one or more processors, e.g., as necessary to execute the logic.

The above detailed description includes references to the accompanying drawings, which form a part of the detailed description. The drawings show, by way of illustration, specific aspects in which the invention can be practiced. These aspects are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other aspects can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed aspect. Thus, the following claims are hereby incorporated into the Detailed Description, with each claim standing on its own as a separate aspect, and it is contemplated that such aspects can be combined with each other in various combinations or permutations. The scope of the invention should be determined with reference to the appended claims, along with the full scope of equivalents to which such claims are legally entitled.

What is claimed is:

1. A method comprising:
   maintaining a plate voltage at a first access line of a memory cell during at least a first operation and a second operation of the memory cell;
   charging a second access line to a first voltage greater than zero and greater than a threshold voltage of a selector device of the memory cell during the first operation on the memory cell; and
   subsequent to the first operation, charging the second access line to a second voltage greater than the plate voltage plus the threshold voltage of the selector device to perform the second operation of the memory cell.

2. The method of claim 1, wherein the first operation comprises a sensing operation and wherein performing the sensing operation comprises setting a voltage on a third access line to a sensing voltage.

3. The method of claim 2, wherein the sensing voltage is lower than the plate voltage by about a programming voltage.

4. The method of claim 2, wherein the second access line comprises a word line for accessing a row of memory cells of a memory array.

5. The method of claim 2, wherein the second operation comprises a programming operation.

6. The method of claim 5, wherein the programming operation comprises setting a voltage on the third access line to a voltage equal to the plate voltage plus a programming voltage.

7. The method of claim 6, wherein the second voltage is about equal to the plate voltage plus the first voltage plus the programming voltage.

8. A memory device, comprising:
an array of memory cells, the array comprised of a plurality of first access lines coupled to capacitive elements of respective memory cells of the array, a plurality of rows of memory cells coupled to respective second access lines, and a plurality columns of memory cells coupled to respective third access lines;
a plurality of selector devices coupled to the array such that at a gate of a selector device of the plurality of selector devices is coupled to a respective second access line of the array, a source of the selector device is coupled to a respective first access line, and a drain of the selector device is coupled to a respective third access line; and
a controller coupled to the array and configured to control selector devices to:
maintain a plate voltage at a first access line of a memory cell during at least a first operation and a second operation of the memory cell;
charge a second access line to a first voltage greater than zero and greater than a threshold voltage of a selector device of the memory cell during the first operation on the memory cell; and
subsequent to the first operation, charge the second access line to a second voltage greater than the plate voltage plus the threshold voltage of the selector device to perform the second operation of the memory cell.

9. The memory device of claim 8, wherein a voltage drop across the selector device is less than or equal to three volts throughout the first operation and the second operation.

10. The memory device of claim 8, wherein a leakage between second access lines and third access lines is less than about 10 nanoamps.

11. The memory device of claim 8, wherein the first operation comprises a sensing operation and wherein the controller is configured to control the sensing operation by setting a voltage on a third access line to a sensing voltage.

12. The memory device of claim 11, wherein the sensing voltage is lower than the plate voltage by about a programming voltage.

13. The memory device of claim 11, wherein the second access line comprises a word line for accessing a row of memory cells of a memory array.

14. The memory device of claim 11, wherein the second operation comprises a programming operation.

15. The memory device of claim 14, wherein the controller is configured to control the programming operation by setting a voltage on the third access line to a voltage equal to the plate voltage plus a programming voltage.

16. The memory device of claim 15, wherein the second voltage is about equal to the plate voltage plus the first voltage plus the programming voltage.

17. An apparatus comprising:
an array of memory cells, the array comprised of a plurality of first access lines coupled to capacitive elements of respective memory cells of the array, a plurality of rows of memory cells coupled to respective second access lines, and a plurality columns of memory cells coupled to respective third access lines; and
a sense component coupled to the array and configured to:
maintain a plate voltage at a first access line of a memory cell during at least a first operation and a second operation of the memory cell;
charge a second access line to a first voltage greater than zero and greater than a threshold voltage of a selector device of the memory cell during the first operation on the memory cell; and
subsequent to the first operation, charge the second access line to a second voltage greater than the plate voltage plus the threshold voltage of the selector device to perform the second operation of the memory cell.

18. The apparatus of claim 17, wherein a leakage between second access lines and third access lines is less than about 10 nanoamps.

19. The apparatus of claim 17, wherein the first operation comprises a sensing operation and wherein the sense component is configured to set a voltage on a third access line to a sensing voltage.

20. The apparatus of claim 19, wherein the sensing voltage is lower than the plate voltage by about a programming voltage.

21. The apparatus of claim 19, wherein the second access line comprises a word line for accessing a row of memory cells of a memory array.

22. The apparatus of claim 19, wherein the second operation comprises a programming operation, and wherein the sense component is configured to set a voltage on the third access line to a voltage equal to the plate voltage plus a programming voltage during the programming operation.

23. The apparatus of claim 22, wherein the second voltage is about equal to the plate voltage plus the first voltage plus the programming voltage.

* * * * *